US006182958B1

(12) United States Patent
Sidone et al.

(10) Patent No.: US 6,182,958 B1
(45) Date of Patent: Feb. 6, 2001

(54) FIXTURE FOR SECURING A COMPONENT TO A HEAT SINK

(75) Inventors: Girard Sidone; Nagesh Ramamoorthy Basavanhally, both of Trenton, NJ (US); Charles Joseph Buondelmonte, Yardley, PA (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/351,496

(22) Filed: Jul. 12, 1999

(51) Int. Cl.[7] ........................................................ B25B 1/00
(52) U.S. Cl. ........................................ 269/254 R; 269/903
(58) Field of Search ................................. 269/903, 254 R

(56) References Cited

U.S. PATENT DOCUMENTS

| 5,060,846 | 10/1991 | Schaeffer et al. . | |
|---|---|---|---|
| 5,142,239 | 8/1992 | Brayton et al. . | |
| 5,241,215 | 8/1993 | Schmidt et al. . | |
| 5,251,098 | 10/1993 | Schmidt . | |
| 5,323,532 | 6/1994 | Schmidt et al. . | |
| 5,392,193 | 2/1995 | Robertson, Jr. et al. . | |
| 5,850,691 | * 12/1998 | Bell | 269/903 |
| 5,871,629 | * 12/1998 | Watts | 269/903 |
| 5,988,619 | * 11/1999 | Wark et al. | 269/903 |

* cited by examiner

Primary Examiner—Stephen F. Gerrity
Assistant Examiner—Lee Wilson
(74) Attorney, Agent, or Firm—Duane, Morris & Heckscher LLP

(57) ABSTRACT

A fixture assembly for securing a component to a heat sink includes a frame having two parallel longitudinal members connected by first and second transverse crossbeams, which together define a receptacle into which a component is received. A spring clip is rotatably attached to the frame and has a position in which the spring clip presses the component against a heat sink. The frame includes at least two depending legs for supporting the frame above the surface of a heat sink, and at least one opening for receiving a fastener that secures the frame to the heat sink. A guide peg or similar positioning structure may also be provided for positioning the frame on the heat sink. The spring clip includes a proximal end having a non-round cross section which is rotatably attached to the first transverse crossbeam of the frame, and a distal end which includes a resilient lip which is detachably engage able with the second transverse crossbeam. In another embodiment of the invention, the fixture includes a frame having a pair of receptacles each having a spring clip associated therewith, for simultaneously securing two electronic components to a heat sink.

16 Claims, 5 Drawing Sheets

FIXTURE FOR SECURING A COMPONENT TO A HEAT SINK

FIELD OF THE INVENTION

The invention relates to apparatus and methods for attaching a component to a heat sink.

BACKGROUND OF THE INVENTION

Solid-state amplifier circuits typically include transistors that are mounted to printed wiring boards (PWBs). The PWBs are mounted to pallets, which are typically heat sinks that draw heat from the componentry. In a typical configuration, the printed wiring board includes an opening into which the transistor is inserted. The transistor leads are connected to the PWB and the bottom of the transistor casing may be soldered to the heat sink.

Soldering the casings (electrical ground) of the transistors to the metallic heat sinks provides a number or performance advantages. In the case of high-powered RF transistors, soldering transistor casings to heat sinks can result in significant improvements in both thermal and RF performance. The nature of the solder joint between the two surfaces is critical to transistor performance. Optimal solder joints must cover a significant portion of the surfaces and must be of controlled thickness.

In one known method of attachment, solder preforms are used to join transistor casings to heat sinks. Solder preforms provide the type of joint control required to optimize transistor performance. However, in order to ensure proper adhesion between the joined surfaces when using a solder preform, the transistor must be pressed against the heat sink with a predetermined and evenly distributed force while the joint is being soldered.

Accordingly, there is a need for an apparatus that can be used to position and secure a transistor to a heat sink with a prescribed force, to permit the transistor to be soldered to the heat sink in an effective, quick, accurate, and repeatable manner.

SUMMARY OF THE INVENTION

The present invention provides a fixture and method for securing a component to a heat sink for either normal operative or for attaching the component to the heat sink. The fixture includes a frame which is fastenable to a heat sink and which defines a receptacle into which a component is received. A spring clip which is rotatably attached to the frame has a position in which the spring clip presses the component against the heat sink.

BRIEF DESCRIPTION OF THE DRAWINGS

These and other features and advantages of the invention are more fully disclosed or rendered apparent from the following description of certain preferred embodiments of the invention, which are to be considered together with the accompanying drawings wherein like numbers refer to like parts and further wherein.

DETAILED DESCRIPTION OF THE PREFERRED EMBODIMENT

Figure 1:
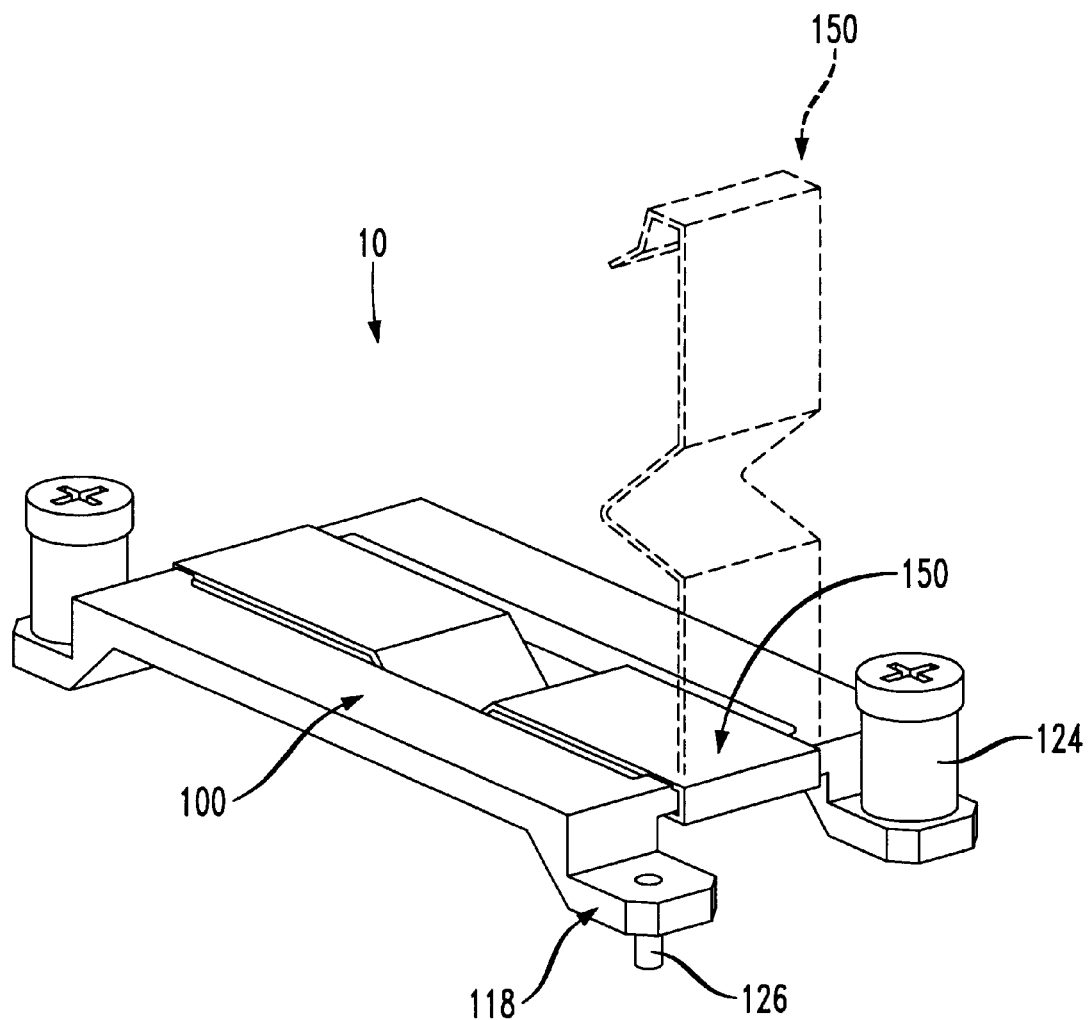
FIG. 1 is an isometric view of a fixture assembly in accordance with the invention.

Referring to FIG. 1, a fixture assembly 10 for securing a component (which may be an electronic component) to a pallet includes, comprises a frame 100 and a spring clip 150. Preferably, the pallet is a heat sink more particularly, with reference to FIG. 2, frame 100 may include two parallel longitudinal members 112 connected by first and second transverse crossbeams 114 which together define a receptacle 116 for receiving a component.

Frame 100 is preferably supported above the surface of the heat sink and is designed to eliminate interferences between the fixture and the pallet or other components attached thereto. In the embodiment shown, frame 100 includes four depending legs 118, 120 which support frame 100 above the surface of the heat sink. Two of the supporting legs 118 each include a positioning structure for positioning the frame on the heat sink. The structures may include projections which mate with complementary apertures in the heat sink, or alternatively may include bores or recesses for receiving corresponding projections formed on the heat sink. In the embodiment shown, the positioning structures comprise guide pegs 126.

The other two legs 120 each include a vertical bore 122, for receiving fasteners 124, that are used to detachably secure the fixture assembly to the heat sink. Suitable fastening devices include, but are not limited to, threaded fasteners, or equivalent devices that provide a secure connection between the frame and the heat sink and permit later disassembly. Preferably, the fasteners 124 are threaded and engage complementary threaded holes in the heat sink. In the preferred embodiment, both the guide pegs 126 and the fasteners 124 are press fit into respective bores in the frame 100.

The frame can be formed from any suitably rigid material and may be cast or machined from a unitary metal plate or bar stock. Advantageously, the frame is designed symmetrically so that it can be installed in either position. This reduces the time required for a user to position the fixture on a heat sink. It will be appreciated that other frame configurations are contemplated within the scope of the invention, and may be desirable, depending on the particular application and the size or shape of both the individual electronic components and the corresponding heat sinks or pallets.

Figure 3:
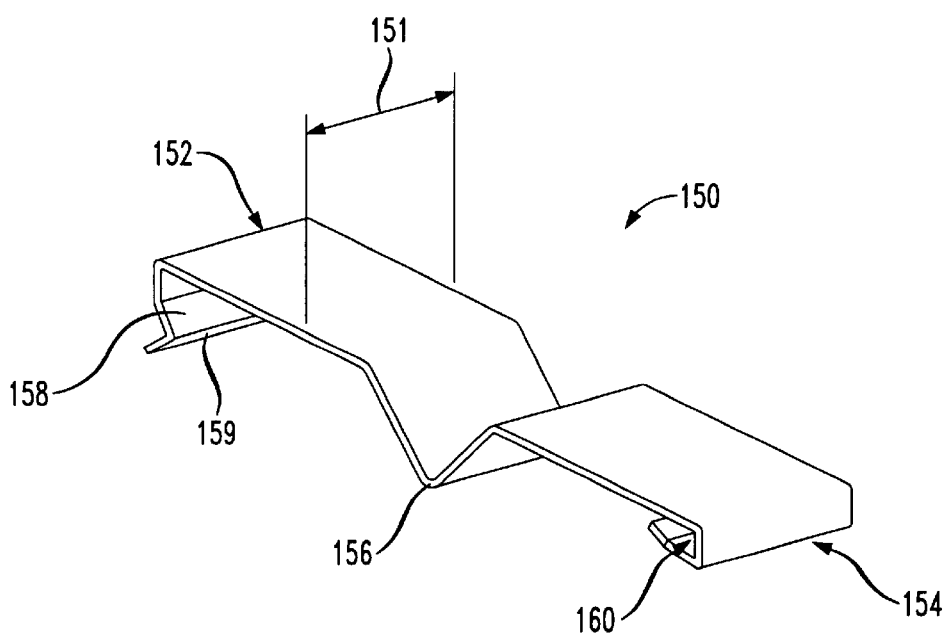
FIG. 3 is an isometric view of the spring clip forming part of the fixture assembly of FIG. 1.

Referring to FIG. 3, spring clip 150 is formed from a unitary strip of resilient spring steel capable of withstanding a solder reflow temperature of 240 degrees centigrade. The spring clip 150 incudes a proximal end 152, a distal end 154, and a projection 156 formed between the proximal and distal ends that presses the electronic component against the heat sink. The spring clip has a width 151, that evenly distributes the force provided by the clip across the width of the component. The proximal end 152 includes a lip 158 which is detachably engageable with first crossbeam 114. Tab 159 extends from and is coextensive with lip 158 and allows a user to easily detach lip 156 from crossbeam 114. Distal end 154 is folded under itself to form a hinge 160 having a substantially U-shaped cross-section. Hinge 160 is rotatably engageable with second crossbeam 114. Projection 156, formed in the medial portion of spring clip 150, has a V-shaped cross-section. It will be understood that projection 156 is not limited to the precise configuration shown. Alternative embodiments may also include, but are not limited to, projections having hyperbolic, parabolic, elliptical, or polygonal cross-sections.

Figure 2:
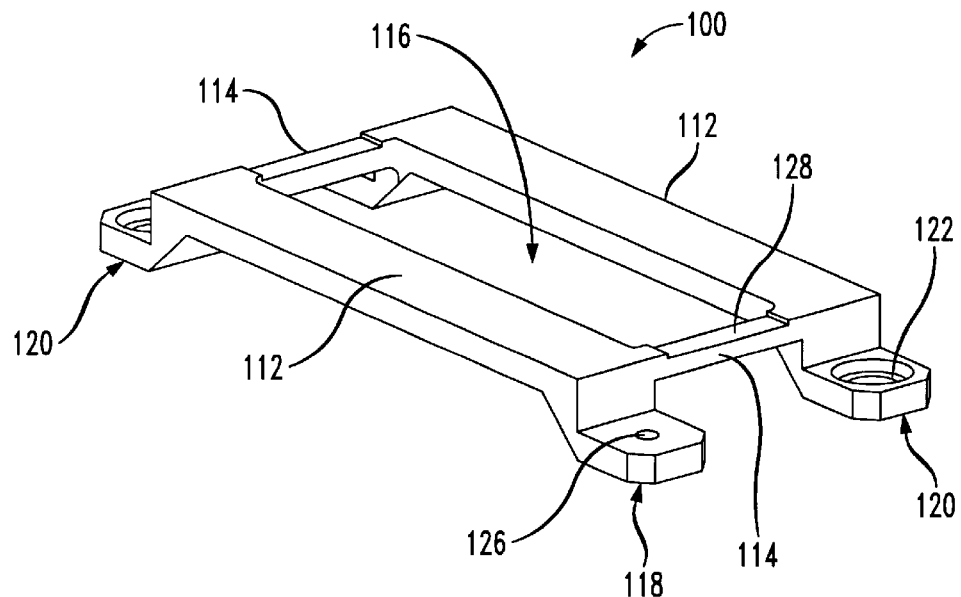
FIG. 2 is an isometric view of the frame forming part of the fixture assembly of FIGI.

As shown in FIGS. 2 and 3, hinge 160 has a cross-section which is rotatably engageable with second crossbeam 114. Crossbeam 114 includes a square cross-section having chamfered edges 128, enabling spring clip 150 to rotate on crossbeam 114 between at least about 0 and about 90 degrees relative to the plane of the frame. In an open position, spring clip 150 has an angular orientation of about 90 degrees with respect to the plane of frame 100, and alternatively functions as a handle to lift, manipulate and position the frame on the heat sink. Although a circular cross-section may be used, hinge 160 preferably comprises a non-round cross-section. Advantageously, the non-round cross-section of hinge 160 allows the spring clip to be temporarily locked in a 90 degree position (shown in phantom in FIG. 1) relative to the plane of the frame. Once the spring clip 150 is manually rotated to a 90 degree (open) orientation (to allow access to receptacle 116), the spring clip 116 remains in that position until it is manually rotated to a 0 degree (closed) orientation, thereby providing a user with unobstructed access to the frame receptacle 116.

In its closed position, spring clip 150 has an angular orientation of about 0 degrees with respect to the plane of frame 100, and lip 158 is engaged with first crossbeam 114 to lock the spring clip in position when supplying its load. In this position, projection 156 is received into receptacle 116, to press against a component disposed therein. The spring clip is designed to have a predetermined interference fit with the component being secured to the heat silk. When a component is secured to a heat sink in accordance with the invention described herein, the spring clip is designed to resiliently deflect to the extent necessary to achieve desired loading on the component. It is preferred that projection 156 of spring clip 150 exert a force on the component of between about 2.22 newtons (0.5 lb force) and about 8.88 newtons (2 lb force).

The following tables show loading calculations for two exemplary spring clips provided in accordance with the invention. The calculations are based on the loading diagrams as shown if FIGS. 4a, 4b. Each table shows the required interference fit between a component and the spring clip projection needed to achieve loadings in the range of 0.5 lb force–2 lb force.

TABLE 1

Material: 17-7 Ph Stainless, Rc 35
20060 small

| | | | | |
|---|---|---|---|---|
| Load at Transistor (R2) in lb. | 0.5 | 1 | 1.5 | 2 |
| Reaction at Pivot (R1) in lb. | 0.329 | 0.657 | 0.986 | 1.315 |
| Applied Load (F) in lb. | 0.171 | 0.3425 | 0.514 | 0.685 |
| Deflection at Load (inches) (20060 small) | 0.014 | 0.027 | 0.041 | 0.054 |
| Bending Stress (psi) (straight beam) | 9121.929 | 18243.857 | 27365.786 | 36487.715 |
| Bend Stress (psi) (inner curvature) | 10680.204 | 21360.408 | 32040.612 | 42720.816 |
| Bend Stress (psi) (outer curvature) | 7929.962 | 15859.924 | 23789.886 | 31719.848 |
| Number of cycles to failure | infinite > 1e6 | infinite > 1e6 | infinite > 1e6 | 5.16E + 05 |

Width = 0.315 inches
Thickness = 0.018 inches
a = 0.906 inches
L = 0.472 inches
r0 = 0.05 inches
ri = 0.032 inches

TABLE 2

20120 medium

| | | | | |
|---|---|---|---|---|
| Load at Transistor (R2) in lb. | 0.5 | 1 | 1.5 | 2 |
| Reaction at Pivot (R1) in lb. | 0.222 | 0.443 | 0.665 | 0.886 |
| Applied Load (F) in lb. | 0.278 | 0.556 | 0.835 | 1.114 |
| Deflection at Load (inches) (20120 medium) | 0.0147 | 0.029 | 0.0442 | 0.059 |
| Bending Stress (psi) (straight beam) | 8577.433 | 17154.866 | 25732.299 | 34309.732 |

TABLE 2-continued

20120 medium

| | | | | |
|---|---|---|---|---|
| Bend Stress (psi) (inner curvature) | 10042.693 | 10085.388 | 30128.081 | 40170.775 |
| Bend Stress (psi) (outer curvature) | 7456.616 | 14913.232 | 22369.848 | 29826.464 |
| Number of cycles to failure | infinite > 1e6 | infinite > 1e6 | infinite > 1e6 | 6.74E + 05 |

Figure 4A:
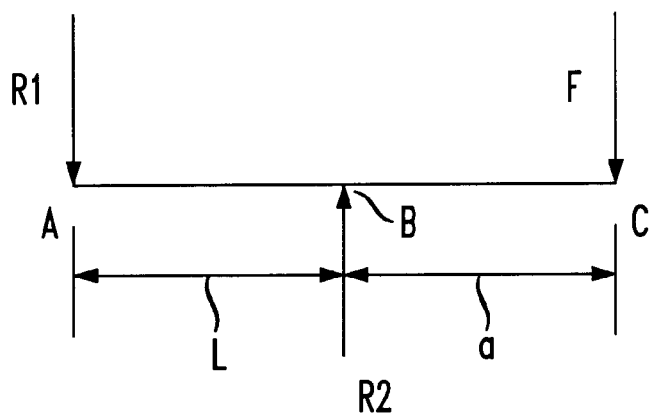
FIGS. 4a and 4b show loading diagrams for the spring clip forming part of the fixture assembly of FIG. 1.
Figure 4B:
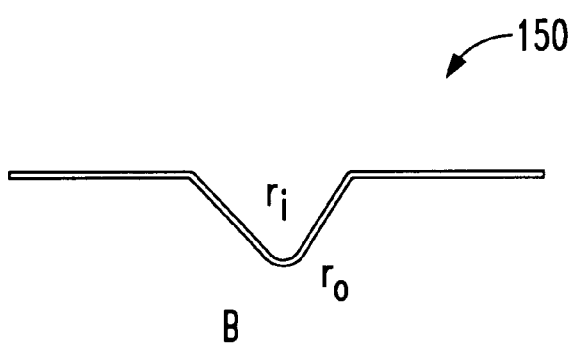

Width = 0.472 inches
Thickness 0.018 inches
a = 0.785 inches
L = 0.987 inches
r0 = 0.05 inches
ri = 0.032 inches For example, as shown in Table 1, and with reference to FIGS. 4a and 4b, load calculations are provided for a stainless steel spring clip having a Rockwell hardness of 35. The spring clip has a width of 0.315 inches, a thickness of 0.0 18 inches, and includes a projection having an outer radius (r0) of 0.05 inches, and an inner radius (ri) of 0.032 inches. Referring to the first column of Table 1, calculations are provided based on a desired resultant load (R2) at the transistor of 0.5 lb force, at a distance (L) of 0.472 inches from the pivot point (A) of the spring clip. The calculations show that by applying a load of 0.171 lb force at point (C), a deflection of 0.014 inches is required at point (B) to achieve a 0.5 lb force load on the transistor, with a reactive load of 0.329 lb force at point (A).

Figure 5:
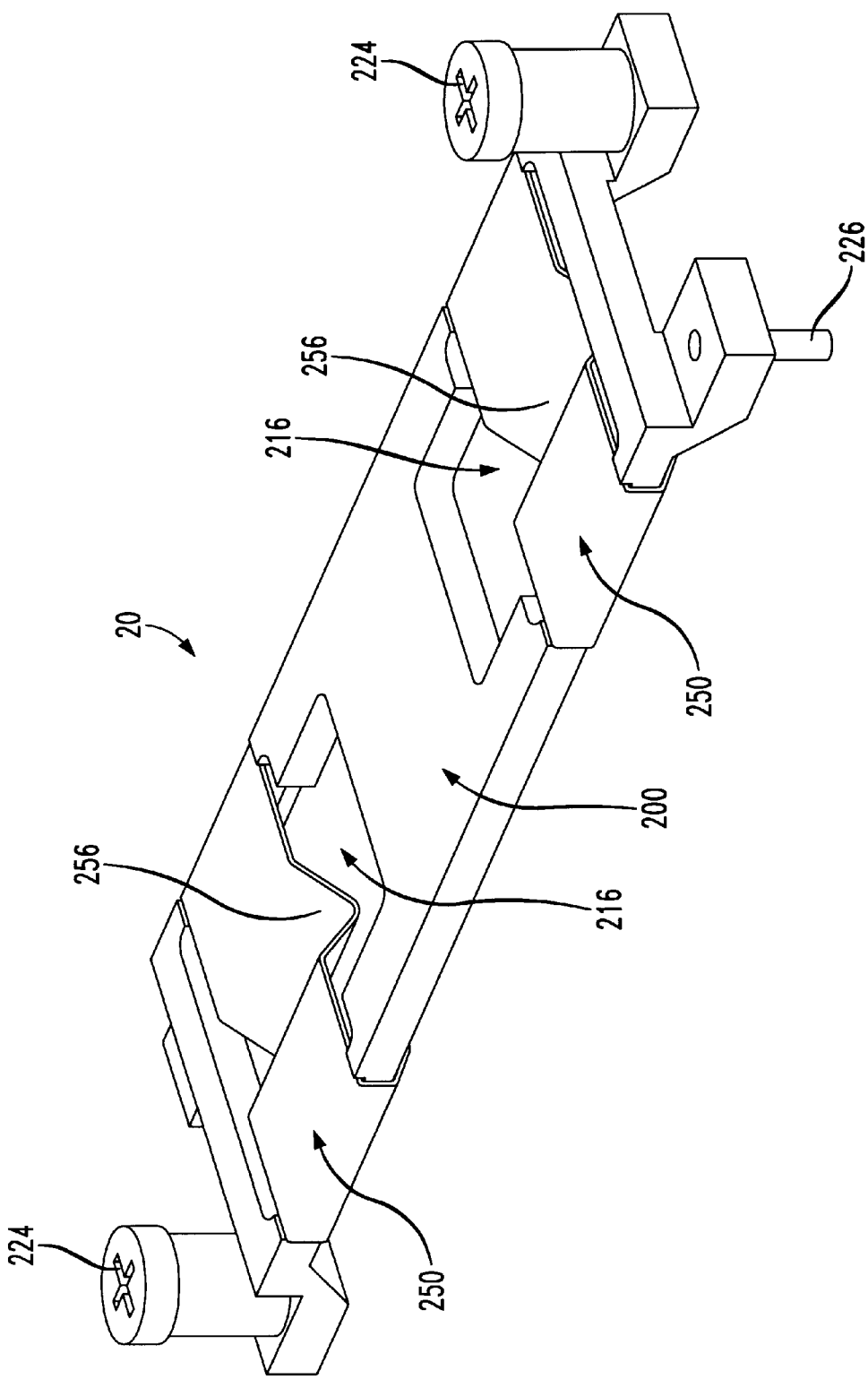
FIG. 5 is an isometric view of a fixture assembly in accordance with another preferred embodiment of the invention.

FIG. 5 shows another embodiment of the invention in which the fixture assembly is designed to secure two components to a heat sink simultaneously. Fixture assembly 20 includes a frame 200 defining a pair of receptacles 216. A pair of spring clips 250 are rotatably secured to frame 200. Each spring clip 250 includes a projection 256, which is received into a corresponding receptacle 216 when the spring clip is oriented in a closed position with respect to frame 200. It will be appreciated that the receptacles need not be identical in size or shape, and that both the number of receptacles and spring clips can be varied to suit a user's particular needs.

Figure 6:
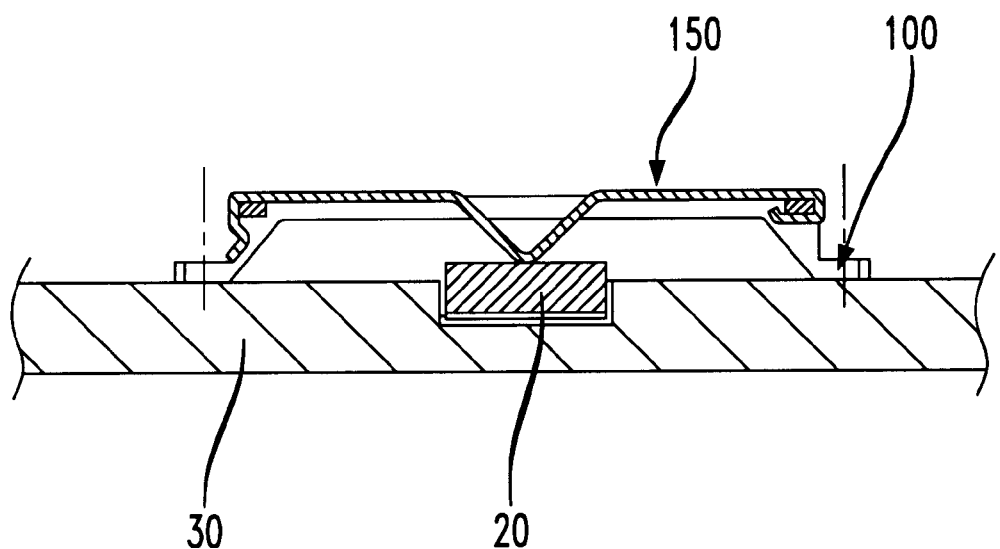
FIG. 6 is a cross-section elevational view of a fixture assembly of FIG. 1 used to secure a transistor to a heat sink.

FIG. 6. shows a cross-section elevational view of fixture assembly 10, securing a component 20 to a heat sink 30. In this embodiment, the component 20 is a transistor and the heat sink is a metal pallet. Frame 100 is fastened to heat sink 20 and spring clip 150 is locked into a closed position to press transistor 20 against the heat sink.

The invention having been disclosed in connection with foregoing variations and examples, additional variations will now be apparent to those skilled in the art. The invention is not intended to be limited to the variations specifically mentioned, and accordingly reference should be made to the appended claims rather than the foregoing discussion of preferred examples, to assess the scope of the invention in which exclusive rights are claimed. Moreover, the claims are to be construed broadly to include other variations and embodiments of the invention which can be made by those skilled in the art.

What is claimed is:

1. A fixture for securing a component to a pallet comprising:

a frame defining a receptacle for containing the component;

at least one opening for receiving a fastener that secures the frame to the pallet; and a spring clip attached to the frame, the spring clip having a position in which the spring clip presses the component against the pallet, wherein first and second crossbeams define opposite edges of the frame receptacle, and the first end of the spring clip is rotatable attached to the first crossbeam.

2. The fixture of claim 1 wherein the spring clip exerts a force on the electronic component of between about 2.22 newtons and about 8.88 newtons.

3. The fixture of claim 2 wherein the spring clip comprises a resilient strip having proximal and distal ends, and a projection formed between the proximal and distal ends which exerts the force on the electronic component.

4. The fixture of claim 1 wherein the frame includes at least two depending legs for supporting the frame above the pallet.

5. The fixture of claim 1 wherein the first crossbeam includes chamfered edges to allow rotation of the spring clip.

6. The fixture of claim 1 wherein the distal end of the spring clip includes a resilient lip detachably engageable with the second cross member for securing the component to the pallet.

7. The fixture of claim 6 wherein the proximal end of the spring clip includes a non-round cross section and is rotatably attached to the first crossbeam, whereby the spring clip is rotatable at least between about 0 and about 90 degrees relative to the plane of the frame.

8. The fixture of claim 1 further comprising at least one positioning structure for positioning the frame on the pallet.

9. The fixture of claim 8 wherein the positioning structure comprises a guide peg.

10. The fixture of claim 1 wherein the component is a transistor.

11. The fixture of claim 1 wherein the pallet comprises a heat sink.

12. A fixture for securing a plurality of electronic components to a pallet comprising:

a frame defining at least one receptacle for containing the electronic components;

at least one opening for receiving a fastener that secures the frame to the pallet; and a pair of spring clips rotatably attached to the frame, the spring clips each having a position in which the spring clips press the electronic components against the pallet.

13. The fixture of claim 12 wherein the frame defines two receptacles for containing the electronic components, and each spring clip includes a projection which is received into a respective frame receptacle.

14. A method for securing an electronic component to a pallet comprising the steps of:

provustrating a fixture which is detachably securable to the pallet, the fixture having a frame defining a receptacle for containing the electronic component and including a spring clip which is rotatably attached to frame;

securing the fixture on the pallet;

positioning the electronic component in the frame receptacle; and rotating the spring clip to a position in which the spring clip presses the electronic component against the pallet.

15. The method of claim 14 wherein the spring clip includes a projection which presses the electronic component against the pallet.

16. The method of claim 15 wherein the pallet comprises a heat sink.

* * * * *